(12) United States Patent
Dadheech et al.

(10) Patent No.: US 9,905,847 B2
(45) Date of Patent: Feb. 27, 2018

(54) FORMING ELECTRODE ACTIVE MATERIALS

(71) Applicant: GM GLOBAL TECHNOLOGY OPERATIONS LLC, Detroit, MI (US)

(72) Inventors: Gayatri V. Dadheech, Bloomfield Hills, MI (US); Xingcheng Xiao, Troy, MI (US); Mei Cai, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 89 days.

(21) Appl. No.: 14/945,166

(22) Filed: Nov. 18, 2015

(65) Prior Publication Data

US 2017/0141383 A1  May 18, 2017

(51) Int. Cl.
| | |
|---|---|
| *H01M 4/04* | (2006.01) |
| *H01M 4/36* | (2006.01) |
| *H01M 4/48* | (2010.01) |
| *H01M 4/38* | (2006.01) |
| *H01M 4/62* | (2006.01) |
| *C23C 14/00* | (2006.01) |
| *C23C 14/06* | (2006.01) |
| *H01M 4/02* | (2006.01) |

(52) U.S. Cl.
CPC ......... *H01M 4/366* (2013.01); *C23C 14/0042* (2013.01); *C23C 14/0605* (2013.01); *H01M 4/0426* (2013.01); *H01M 4/38* (2013.01); *H01M 4/386* (2013.01); *H01M 4/483* (2013.01); *H01M 4/625* (2013.01); *H01M 2004/021* (2013.01)

(58) Field of Classification Search
None
See application file for complete search history.

(56) References Cited

U.S. PATENT DOCUMENTS

| | | | |
|---|---|---|---|
| 7,736,805 B2 | 6/2010 | Nazri et al. | |
| 8,101,152 B1 | 1/2012 | Halalay et al. | |
| 8,399,138 B2 | 3/2013 | Timmons | |
| 8,420,259 B2 | 4/2013 | Xiao et al. | |
| 8,440,350 B1 | 5/2013 | Verbrugge et al. | |
| 8,642,201 B2 | 2/2014 | Cheng et al. | |
| 8,658,295 B2 | 2/2014 | Cheng et al. | |
| 8,663,840 B2 | 3/2014 | Nazri et al. | |
| 8,974,946 B2 | 3/2015 | Cai et al. | |
| 8,999,584 B2 | 4/2015 | Jiang et al. | |
| 9,012,075 B2 | 4/2015 | Verbrugge et al. | |
| 9,028,565 B2 | 5/2015 | Huang | |

(Continued)

FOREIGN PATENT DOCUMENTS

| | | | | |
|---|---|---|---|---|
| CN | 103779546 | * | 5/2014 | ............ H01M 4/38 |
| CN | 104269559 | | 1/2015 | |
| WO | WO-2015176241 A1 | | 11/2015 | |

OTHER PUBLICATIONS

English translation of CN 103779546 (2014).*

*Primary Examiner* — Yoshitoshi Takeuchi
(74) *Attorney, Agent, or Firm* — Harness, Dickey & Pierce, P.L.C.

(57) ABSTRACT

In an example of a method for making an electrode active material, a sacrificial layer is formed on a nanomaterial. Carbon is coated on the sacrificial layer to form a carbon layer. Titanium dioxide is coated on the carbon layer to form a titanium dioxide layer. The sacrificial layer is removed to form a void between the nanomaterial and the carbon layer.

20 Claims, 5 Drawing Sheets

(56) References Cited

U.S. PATENT DOCUMENTS

| | | |
|---|---|---|
| 9,034,519 B2 | 5/2015 | Xiao et al. |
| 9,093,705 B2 | 7/2015 | Xiao et al. |
| 9,123,939 B2 | 9/2015 | Xiao et al. |
| 9,142,830 B2 | 9/2015 | Xiao et al. |
| 9,153,813 B2 | 10/2015 | Kim |
| 9,160,036 B2 | 10/2015 | Yang et al. |
| 9,350,046 B2 | 5/2016 | Huang |
| 9,362,551 B2 | 6/2016 | Sachdev et al. |
| 9,362,552 B2 | 6/2016 | Sohn et al. |
| 9,379,374 B2 | 6/2016 | Liu et al. |
| 9,412,986 B2 | 8/2016 | Huang |
| 9,455,430 B2 | 9/2016 | Huang et al. |
| 9,537,144 B2 | 1/2017 | Huang et al. |
| 2008/0261116 A1 | 10/2008 | Burton et al. |
| 2009/0325071 A1 | 12/2009 | Verbrugge et al. |
| 2012/0100403 A1 | 4/2012 | Wang et al. |
| 2012/0219852 A1 | 8/2012 | Huang et al. |
| 2012/0229096 A1 | 9/2012 | Nazri |
| 2012/0231321 A1 | 9/2012 | Huang et al. |
| 2012/0301790 A1 | 11/2012 | Xiao et al. |
| 2012/0308853 A1 | 12/2012 | Vanimisetti et al. |
| 2012/0328927 A1 | 12/2012 | Timmons et al. |
| 2013/0071736 A1 | 3/2013 | Xiao et al. |
| 2013/0099159 A1 | 4/2013 | Halalay et al. |
| 2013/0157125 A1 | 6/2013 | Sachdev et al. |
| 2013/0177804 A1 | 7/2013 | Verbrugge et al. |
| 2013/0284338 A1 | 10/2013 | Xiao et al. |
| 2013/0323595 A1* | 12/2013 | Sohn .............. H01M 4/134 429/221 |
| 2014/0272526 A1 | 9/2014 | Huang |
| 2014/0272558 A1 | 9/2014 | Xiao et al. |
| 2014/0272578 A1 | 9/2014 | Xiao et al. |
| 2015/0014890 A1 | 1/2015 | Xiao |
| 2016/0111721 A1 | 4/2016 | Xiao et al. |

\* cited by examiner

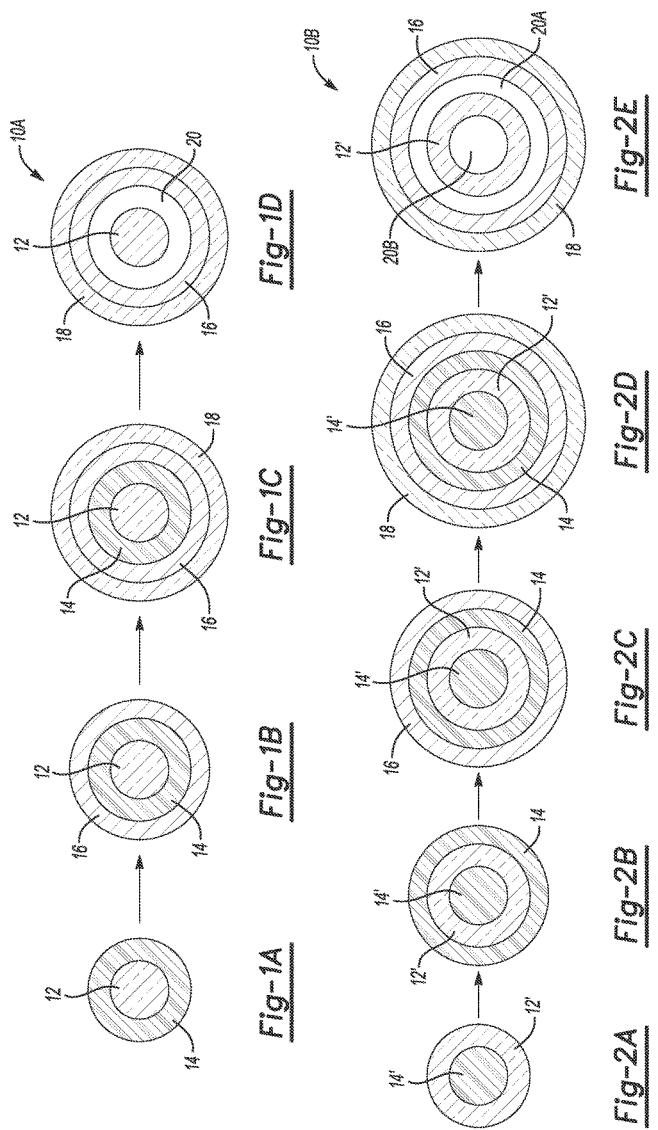

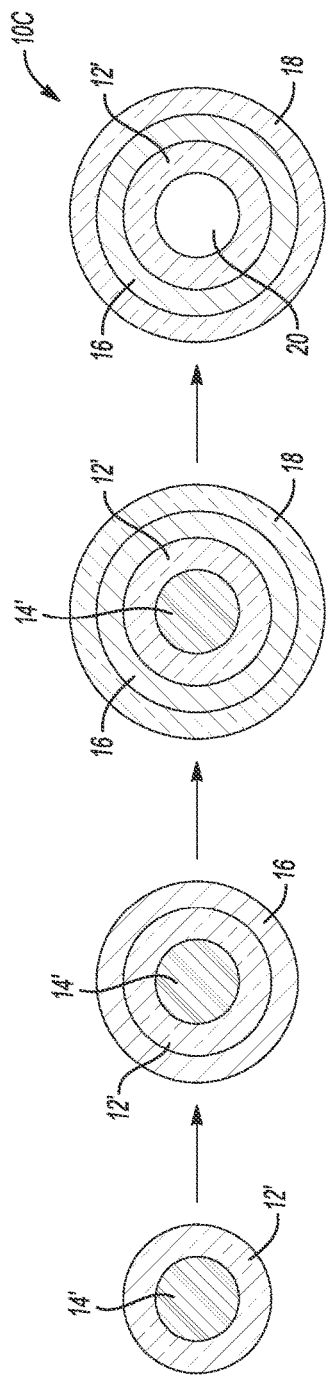
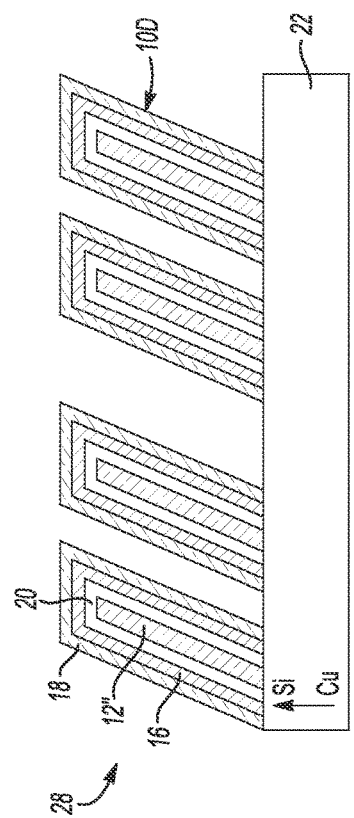

ly degrade,
FORMING ELECTRODE ACTIVE MATERIALS

BACKGROUND

Secondary, or rechargeable, lithium-based batteries are often used in many stationary and portable devices such as those encountered in the consumer electronic, automobile, and aerospace industries. The lithium class of batteries has gained popularity for various reasons including a relatively high energy density, a general nonappearance of any memory effect when compared to other kinds of rechargeable batteries, a relatively low internal resistance, and a low self-discharge rate when not in use. The ability of lithium ion batteries to undergo repeated power cycling over their useful lifetimes makes them an attractive and dependable power source.

SUMMARY

In an example of a method for making an electrode active material, a sacrificial layer is formed on a nanomaterial. Carbon is coated on the sacrificial layer to form a carbon layer. Titanium dioxide is coated on the carbon layer to form a titanium dioxide layer. The sacrificial layer is removed to form a void between the nanomaterial and the carbon layer.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1D are schematic, cross-sectional views which together illustrate an example of a method for making an example of an electrode active material;

FIGS. 2A through 2E are schematic, cross-sectional views which together illustrate another example of the method for making another example of an electrode active material;

FIGS. 3A through 3D are schematic, cross-sectional views which together illustrate yet another example of the method for making yet another example of an electrode active material;

FIG. 5 is an example of the electrode active material formed via the method shown in FIG. 4;

DETAILED DESCRIPTION

Figure 4:
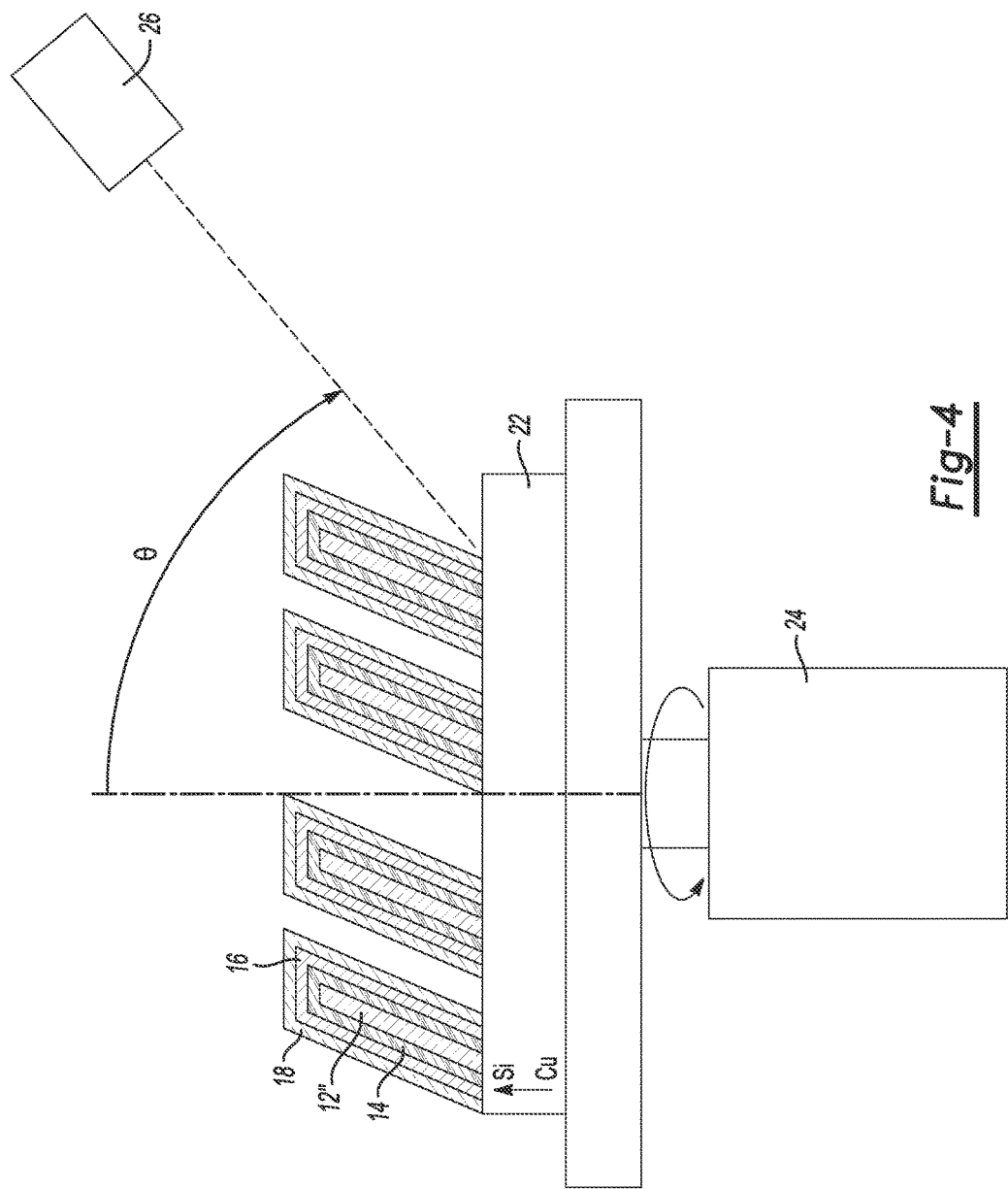
FIG. 4 is a schematic and partially cross-sectional view of still another example of the method for making still another example of an electrode active material.

Lithium-based batteries generally operate by reversibly passing lithium ions between a negative electrode (sometimes called an anode) and a positive electrode (sometimes called a cathode). The negative and positive electrodes are situated on opposite sides of a porous polymer separator soaked with an electrolyte solution that is suitable for conducting the lithium ions. During charging, lithium ions are inserted/intercalated into the negative electrode, and during discharging, lithium ions are extracted from the negative electrode. Each of the electrodes is also associated with respective current collectors, which are connected by an interruptible external circuit that allows an electric current to pass between the negative and positive electrodes. Two examples of lithium-based batteries include the lithium ion battery and the lithium sulfur battery.

The high theoretical capacity (e.g., 4200 mAh/g) of silicon renders it desirable for use as a negative electrode material in lithium ion batteries, while the high theoretical capacity (e.g., 1672 mAh/g) of sulfur renders it desirable for use as a positive electrode material in lithium sulfur batteries. However, it has been found that negative and positive electrode materials with high specific capacities also undergo large electromechanical (volume) expansion and contraction during charging/discharging of the battery. The large volume change (e.g., about 300% for silicon and about 80% for sulfur) experienced by the electrode materials during charging/discharging causes the respective material to fracture, decrepitate, or otherwise mechanically degrade, which results in a loss of electrical contact and poor life cycling.

Moreover, the life cycle of lithium sulfur batteries may be limited by the migration, diffusion, or shuttling of certain species from the positive electrode during the battery discharge process, through the porous polymer separator, to the negative electrode.

In lithium sulfur batteries, this species includes $S_x$ polysulfides generated at a sulfur-based positive electrode. The $S_x$ polysulfides generated at the sulfur-based positive electrode are soluble in the electrolyte, and can migrate to the negative electrode where they react with the negative electrode in a parasitic fashion to generate lower-order polysulfides. These lower-order polysulfides diffuse back to the positive electrode and regenerate the higher forms of polysulfide. As a result, a shuttle effect takes place. This effect leads to decreased sulfur utilization, self-discharge, poor cycleability, and reduced Coulombic efficiency of the battery. It is believed that even a small amount of polysulfide at the negative electrode can lead to parasitic loss of active lithium at the negative electrode, which prevents reversible electrode operation and reduces the useful life of the lithium sulfur battery.

In the examples disclosed herein, a cage-like structure is formed around the silicon or sulfur active material. This cage-like structure includes a porous, layered carbon and titanium dioxide ($TiO_2$) shell. When the $TiO_2$ layer is doped, the layered carbon and doped $TiO_2$ shell can act as an excellent electronic conductor in order to conduct electrons during a battery operation. Additionally, a void (i.e., a free space) is formed between the active material and the cage-like structure and/or at a center of the active material. The void(s) accommodate the volumetric expansion and contraction of the active electrode material during charging/discharging cycles. When the cage-like structure is a host for silicon, the active material may be used in a negative electrode for a lithium ion battery or a lithium sulfur battery. When the cage-like structure is a host for sulfur, the active material may be used in a positive electrode for a lithium sulfur battery.

Examples of the electrode active material disclosed herein, which include the active material and the cage-like structure surrounding the active material, may be formed by several different methods. Different examples of the method will be described in reference to FIGS. 1-4.

FIGS. 1A through 1D illustrate one example of the method for making the electrode active material 10A (shown in FIG. 1D). As shown in FIG. 1A, this example of the method forms a sacrificial layer 14 on a nanomaterial 12. The nanomaterial 12 may have at least one dimension on the nanoscale (e.g., up to 1000 nm), and in some instances, may have at least one dimension up to about 20 μm.

Examples of the nanomaterial 12 include silicon nanoparticles, silicon suboxide ($SiO_x$, where 0<x<2) nanoparticles, silicon alloy nanoparticles, sulfur-based nanoparticles, silicon nanorods, silicon suboxide nanorods, silicon alloy nanorods, sulfur-based nanorods, silicon nanofibers, silicon suboxide nanofibers, silicon alloy nanofibers, sulfur-based nanofibers, silicon nanowires, silicon suboxide nanowires, silicon alloy nanowires, and sulfur-based nanowires. Examples of silicon alloys include silicon tin alloys, silicon nickel alloys, silicon iron alloys, silicon aluminum alloys, silicon boron alloys, or the like. Examples of the sulfur-based nanomaterials may be formed of a sulfur-carbon composite. In an example, the weight ratio of S to C in the sulfur-carbon composite ranges from 1:9 to 8:1.

The silicon nanoparticles may be porous silicon nanoparticles. Porous silicon nanoparticles may be formed via any suitable technique, examples of which include dealloying techniques. For dealloying, silicon nanoparticles and a material that is immiscible in the silicon nanoparticle are selected. Examples of the immiscible material include tin (Sn), aluminum (Al), silver (Ag), indium (In), and iron (Fe).

The atomic ratio of the silicon nanoparticles and the immiscible material may be varied, depending upon the desired morphology of the resulting porous silicon nanoparticles. The atomic ratio of the silicon to the immiscible material may be greater than 1, and in these examples, an interconnected silicon matrix having a high percolation value is formed, which includes relatively small pores formed therein. The atomic ratio of the silicon to the immiscible material may be equal to or less than 1, and in these examples, the immiscible material may be beyond the percolation value, which results in larger, more interconnected pores formed among a less stable silicon matrix.

The silicon and immiscible material are melted together to form a mixture. The melting temperature will depend upon the melting temperatures of the selected materials. As such, the temperature used to form the mixture will be at least the higher melting temperature of the two materials. For example, when silicon is used with tin as the immiscible material, the temperature for melting the materials will be at least 1414° C., which is the melting point of silicon. Tin will also melt at this temperature because its melting point is 231.9° C. As the materials are melted, they may be stirred to form a substantially homogeneous mixture of the two materials.

A nucleation promoter/additive may be added to the mixture to control the precipitation of the immiscible phase during phase separation (discussed below). The selected nucleation promoter/additive may increase the nucleation density of the phase of the immiscible material, and thus contribute to a reduction in the pore size and/or the diameter of the porous, amorphous particles that are ultimately formed. Examples of these nucleation promoters/additives include high melting point materials, such as $Si_3N_4$, SiC, WC, MoC, or the like. Any suitable amount of the nucleation promoter/additive may be added with a weight ratio below 1%.

The mixture is exposed to a rapid solidification process to form a composite. Rapid solidification may be accomplished by cooling the mixture at a rate ranging from about $10^2$ K/s to about $10^5$ K/s. Cooling may be performed until the composite is formed and has a temperature of about room temperature (e.g., ranging from about 18° C. to about 25° C.). Cooling may be performed using a copper wheel, which rotates at a high speed up to 5,000 rpm and is capable of removing heat very rapidly from the mixture. Cooling may also be performed by exposing the mixture to liquid nitrogen, or some other sufficiently cold liquid.

The rapid solidification results in the silicon taking on an amorphous phase. As such, the composite includes amorphous silicon and the immiscible material.

The composite is then exposed to a milling process in order to break up the composite into composite particles having a size ranging from about 100 nm to about 20 μm. When the composite 18 already in the form of particles, it is to be understood that the milling process further reduces the size of the particles to form composite particles having a size ranging from about 100 nm to about 20 μm. The composite particles also include the silicon and the immiscible material.

Milling may be accomplished using ball milling, which involves shaking or milling the composite 18 in the presence of beads. In an example, ball milling may be performed for a time ranging from about 10 minutes to about 50 hours. It is to be understood that longer ball milling leads to smaller particles.

Phase separation of the composite particles is then thermally induced. Upon exposure to annealing (or another suitable heating process), the silicon will thermodynamically precipitate out from the composite particle. Thermally induced phase separation in the examples disclosed herein may be accomplished at a temperature ranging from about 300° C. to about 900° C. The composite particles may be exposed to annealing for a time ranging from about 30 minutes to about 100 hours, and annealing may take place in a vacuum furnace, a vacuum oven, or another suitable heating mechanism. In an example, the annealing also takes place in a protected environment, such as an argon or nitrogen environment.

Phase separation results in the formation of phase separated composite particles. When the atomic ratio of the silicon to the immiscible material used in the mixture is greater than 1, the phase separated composite particles include a matrix of the amorphous silicon having the immiscible material embedded therein. The pores resulting from these phase separated composite particles will be relatively small and will be surrounded by an interconnected matrix of silicon. When the atomic ratio of silicon to the immiscible material used in the mixture is equal to or less than 1, the phase separated composite particles include a matrix of the immiscible material having the silicon embedded therein. It is to be understood that pores resulting from these phase separated particles will be larger and interconnected.

After phase separation is performed, the phase separated composite particles are exposed to a chemical etching process. Any suitable etchant may be used that will remove the immiscible material while leaving the silicon substantially unaffected. In an example, chemical etching is performed using an acid, such as hydrochloric acid (HCl), sulfuric acid ($H_2SO_4$), or nitric acid ($HNO_3$). Exposing the phase separated composite particles to the acid removes the immiscible material and forms pores in the silicon particles. The pores form in those areas previously occupied by the immiscible material. In an example, the size of the pores ranges from about 5 nm to about 1 µm.

In another example of a dealloying technique, a chemical vapor condensation method may be used to make the composite particles. In this method, silicon and immiscible material precursors are utilized. Examples of the silicon precursors include 2,4,6,8,10-pentamethylcyclopentasiloxane $(CH_3SiHO)_5$, pentamethyldisilane $(CH_3)_3SiSi(CH_3)_2H$, silicon tetrabromide $(SiBr_4)$, silicon tetrachloride $(SiCl_4)$, tetraethylsilane $Si(C_2H_5)_4$, and 2,4,6,8-tetramethylcyclotetrasiloxane $(HSiCH_3O)_4$. Examples of the tin precursors include dibutyldiphenyltin $[CH_3(CH_3)_3]_2Sn(C_6H_5)$, hexaphenylditin(IV) $(C_6H_5)_3Sn$, tetraallyltin $(H_2C=CHCH_2)_4Sn$, tetrakis(diethylamido)tin(IV) $[(C_2H_5)_2N]_4Sn$, tetrakis(dimethylamido)tin(IV) $(CH_3)_2N$, tetramethyltin $Sn(CH_3)_4$, tetravinyltin $Sn(CH=CH_2)_4$, tin(II) acetylacetonate $C_{10}H_{14}O_4Sn$, tricyclohexyltin hydride $(C_6H_{11})_3SnH$, trimethyl(phenylethynyl)tin $C_6H_5C\equiv CSn(CH_3)_3$, and trimethyl(phenyl)tin $C_6H_5Sn(CH_3)_3$).

The selected precursors are delivered via respective carrier gases into a heating zone. An example of a suitable carrier gas includes argon plus about 5% hydrogen gas ($H_2$).

The atomic ratio of the silicon and the immiscible material in the composite particles may be varied, in this example, by controlling the carrier gas flow rate for the respective precursors. A higher flow rate for the carrier gas including one of the precursors will increase the atomic ratio of the corresponding material in the composite particles. The atomic ratio in this example will affect the morphology of the silicon matrix and the size of the pores in a similar manner to what was previously described.

In the heating zone, the precursors are exposed to a predetermined temperature, which, in an example, is above 1000° C. Within the heating zone, the precursors are reacted with one another to form an alloy vapor of the silicon and the immiscible material.

The alloy vapor is then delivered to the cooling zone, which is set to a predetermined temperature. In an example, the predetermined temperature of the cooling zone CZ is below about −20° C. Within the cooling zone, the alloy vapor condenses into the composite particles. The cooling zone provides rapid solidification, and the resulting silicon in the composite particles is amorphous.

The composite particles are then subjected to phase separation and etching as previously described. These processes result in the formation of the porous silicon nanoparticles.

Referring back to FIG. 1A, the sacrificial layer 14 is formed on the nanomaterial 12 (regardless of which type is used). The sacrificial layer 14 may be formed of aluminum oxide ($Al_2O_3$) or a polymer. The aluminum oxide sacrificial layer 14 may be deposited by plasma enhanced chemical vapor deposition (PE-CVD), chemical vapor deposition (CVD), molecular layer deposition (MLD), atomic layer deposition (ALD), or a wet chemical process. Precursors that may be used in ALD to form the aluminum oxide sacrificial layer 14 include, for example, aluminum hexafluoroacetylacetonate, aluminum i-propoxide, or aluminum acetylacetonate. The polymer sacrificial layer 14 may be deposited by MLD, plasma polymerization, or a wet chemical process. Examples of the polymer sacrificial layer 14 include aluminum alkoxide polymers, titanium alkoxide polymers, zinc alkoxide polymers, titanium organo nitride, polyester, polyurea, polyimides, poly(vinyl chloride), epoxy resins, or the like.

Carbon is then coated on the sacrificial layer 14 to form a carbon layer 16. The carbon may be deposited using any suitable technique. In one example, the carbon layer 16 is formed using reactive sputtering with graphite as the target. In another example, the carbon layer 16 is formed by simultaneously exposing a solid graphite target to a plasma treatment and an evaporation treatment. The simultaneous plasma and evaporation treatments may be accomplished using pulsed laser deposition, a combination of cathodic arc deposition and laser arc deposition, a combination of plasma exposure and electron beam (e-beam) exposure, a combination of plasma exposure and laser arc deposition, magnetron sputtering, or plasma enhanced physical vapor deposition. In an example, the maximum deposition rate ranges from about 48 nm/min to about 100 nm/min, which can be achieved with a pulse repetition rate ranging from about 1 kHz to about 10 kHz. Still other suitable examples for depositing the carbon include physical vapor deposition (PVD), electron beam evaporation, magnetron sputter deposition, chemical vapor deposition (CVD), molecular layer deposition (MLD), atomic layer deposition (ALD), or a wet chemical process.

The carbon layer 16 is a porous, electrically conductive, continuous coating formed on the surface of the sacrificial layer 14. The carbon layer 16 may be made up of graphitic carbon, having an sp2/sp3 ratio ranging from about 70/30 to about 100/1. In an example, the ratio of $sp^2$ carbon to $sp^3$ carbon in the carbon coating is about 74 to about 26. Depending upon the deposition process that is used, the ratio of $sp^2$ carbon to $sp^3$ carbon may be changed by altering the growth rate, the precursor (target) that is used, and/or the deposition temperature. For example, lowering the deposition temperature to room temperature (e.g., from about 18° C. to about 22° C.) can result in the formation of a primarily graphitic carbon layer.

The carbon layer 16 may also be doped with titanium or silicon. In an example, the dopant makes up less than 20% of the carbon layer 16. Doping the carbon layer 16 may be accomplished using a co-sputtering process.

In an example, the carbon layer 16 has a thickness ranging from about 5 nm to about 50 nm.

Titanium dioxide is then coated on the carbon layer 16 to form a titanium dioxide ($TiO_2$) layer 18. The titanium dioxide may be deposited using any suitable technique. In one example, the $TiO_2$ layer 18 is formed via plasma enhanced chemical vapor deposition, chemical vapor deposition, molecular layer deposition, atomic layer deposition, or a wet chemical process.

The $TiO_2$ layer 18 is a porous, continuous coating formed on the surface of the carbon layer 16. The $TiO_2$ layer 18 may be tailored to be conductive. For example, the $TiO_2$ layer 18 may be doped with a conductive additive (such as nitrogen, sulfur, phosphorus, boron, silver, iron and/or vanadium). During deposition of the $TiO_2$ layer, argon and the dopant may be mixed with nitrogen gas. In an example, the dopant makes up less than 20% of the $TiO_2$ layer 18. The $TiO_2$ layer 18 may also be tailored to be conductive using phase transition. For example, the $TiO_2$ layer 18 may be exposed to annealing in the presence of the dopant after it is deposited. For another example, the deposition parameters during $TiO_2$ deposition may be altered to initiate the phase transition in the presence of the dopant.

In an example, the $TiO_2$ layer 18 has a thickness ranging from about 2 nm to about 20 nm.

The $TiO_2$ layer 18 forms an artificial solid electrolyte interface (SEI) layer at the exterior of the electrode active material 10A (see FIG. 1D). The $TiO_2$ layer 18 minimizes or inhibits the interfacial reactions between the electrolyte and the nanomaterial 12. This prevents an additional SEI layer from growing on the surface of the nanomaterial 12, or reduces the level at which an additional SEI layer grows on the surface of the nanomaterial 12.

When a wet chemical process is used to deposit each of the layers 14, 16, 18, a layer-by-layer deposition process or sol-gel deposition process may be used. In these types of processes, a precursor bath is used to form each layer, and the precursor is changed depending upon the layer 14, 16, 18 to be formed. In the precursor bath, the precursor chemisorbs and bonds to the nanomaterial 12 or the layer 14 or 16 formed thereon to form the layer 14, 16, or 18. Examples of suitable precursors for the sacrificial layer 14 include trimethylaluminum. Examples of suitable precursors for the carbon layer 16 include graphite or other carbon nanoparticles or nanofibers in a suitable resin mixture (e.g., polyimide amide). Examples of suitable precursors for the $TiO_2$ layer 18 include titanium nanoparticles, titanium isopropoxide, titanium isopropoxide, colloidal titania, titanium alkoxide $Ti(OR)_4$, titanic acid and derivatives thereof, Titanium (IV) EDTA, ammonium citraperoxotitanates, organometallic titanium salt, and mixtures thereof.

Referring now to FIG. 1D, the sacrificial layer 14 is then removed to form a void 20 (i.e., free space, unoccupied space, etc.) between the nanomaterial 12 and the carbon layer 16. Both the carbon layer 16 and the $TiO_2$ layer 18 are porous, and a solvent that can leach out the sacrificial layer 14 (while leaving the other layers 16, 18 and material 12 intact) may be used to remove the sacrificial layer 14. For example, an alkali solution may be used to remove the aluminum oxide sacrificial layer 14. Examples of the alkali solution are alkali metal oxides, such as 1M NaOH or 1M KOH. When aluminum oxide is utilized, hydrofluoric acid (HF) is not used. For another example, an organic solvent may be used to remove the polymer sacrificial layer 14. Any organic solvent may be selected that will dissolve the polymer sacrificial layer 14 and not affect the other layer 16, 18 and material 12. Examples of suitable solvents for dissolving examples of the polymer sacrificial layer 14 include benzene, xylene, anisole, or derivatives thereof. In one example, the polymer sacrificial layer 14 is an epoxy resin that can be removed with acetone, toluene, etc. When the polymer sacrificial layer 14 is utilized, it may alternatively be removed via heating. Heating causes the polymer sacrificial layer 14 to decompose. In an example, heating to greater than 80° C. is suitable for decomposing some examples of the polymer sacrificial layer 14. In one example, the polymer sacrificial layer 14 is poly(vinyl chloride) that can be removed by heating at a temperature>200° C. in an inert atmosphere. Still further, when the polymer sacrificial layer 14 is utilized, it may alternatively be removed via plasma etching (e.g., via oxygen, $CF_4$, or CO).

The amount of space that makes up the void 20 may depend upon the thickness of the sacrificial layer 14. It is to be understood that the void 20 provides space to accommodate the volumetric expansion and contraction of the nanomaterial 12 during battery cycling.

Additionally, the cage-like structure of the carbon layer 16 and the $TiO_2$ layer 18 secures the nanomaterial 12 therein. As such, even if the nanomaterial 12 breaks apart, it is contained within the void 20 by the carbon layer 16 and the $TiO_2$ layer 18, which may keep the nanomaterial 12 pieces in conductive contact with each other. The cage-like structure of the carbon layer 16 and the $TiO_2$ layer 18 also protects the sulfur-based nanomaterial 12 (of the lithium sulfur battery), and suppresses polysulfide dissolution into the electrolyte. As such, the cage-like structure of the carbon layer 16 and the $TiO_2$ layer 18 can mitigate the shuttle effect, and in turn improve the efficiency and life cycle of the lithium sulfur battery.

Referring now to FIGS. 2A through 2E, another example of the method for making another example of the electrode active material 10B (shown in FIG. 2E) is depicted. As shown in FIG. 2A, this example of the method forms the nanomaterial 12' on a sacrificial nanomaterial 14'.

In this example, the sacrificial nanomaterial 14' may be in the form of nanoparticles, nanorods, nanofibers, or nanowires. The sacrificial nanomaterial 14' may be formed of aluminum oxide or the previously mentioned polymers.

As shown in FIG. 2A, the nanomaterial 12' is coated on the sacrificial nanomaterial 14'. The nanomaterial 12' may be silicon, silicon suboxide, a silicon alloy, or a sulfur-carbon composite material. The nanomaterial 12' may be deposited by plasma enhanced chemical vapor deposition (PE-CVD), chemical vapor deposition (CVD), molecular layer deposition (MLD), atomic layer deposition (ALD), or a wet chemical process.

As shown in FIG. 2B, the nanomaterial 12' is then coated with the sacrificial layer 14. The sacrificial layer 14 may be aluminum oxide or polymer, and is the same material as the sacrificial nanomaterial 14'. The sacrificial layer 14 may be deposited via any of the methods previously described for the sacrificial layer 14 used in the method of FIGS. 1A-1D.

Carbon is then coated on the sacrificial layer 14 to form the carbon layer 16. This is shown in FIG. 2C. The carbon layer 16 may be deposited via any of the methods previously described for the carbon layer 16 used in the method of FIGS. 1A-1D. The carbon layer 16 may also be doped as previously described.

Titanium dioxide is then coated on the carbon layer 16 to form the $TiO_2$ layer 18. This is shown in FIG. 2D. The $TiO_2$ layer 18 may be deposited via any of the methods previously described for the $TiO_2$ layer 18 used in the method of FIGS. 1A-1D. The $TiO_2$ layer 18 may also be doped or made conductive as previously described.

Referring now to FIG. 2E, the sacrificial nanomaterial 14' and layer 14 are then removed to form voids 20A, 20B (i.e., free spaces, unoccupied spaces, etc.) between the nanomaterial 12' and the carbon layer 16 and at the center of the electrode active material 10B. The nanomaterial 12', carbon layer 16 and the $TiO_2$ layer 18 are porous, and a solvent that can leach out the sacrificial nanomaterial 14' and the sacrificial layer 14 (while leaving the other layers 16, 18 and material 12' intact) may be used to remove the sacrificial nanomaterial 14' and the sacrificial layer 14. For example, an alkali solution may be used to remove the aluminum oxide sacrificial nanomaterial 14' and layer 14. For another example, an organic solvent may be used to remove the polymer sacrificial nanomaterial 14' and layer 14. Any organic solvent may be selected that will dissolve the polymer sacrificial nanomaterial 14' and layer 14 and not affect the other layer 16, 18 and material 12'. When the polymer sacrificial nanomaterial 14' and layer 14 are utilized, they may alternatively be removed via heating or plasma etching.

The amount of space that makes up the voids 20A, 20B may depend upon the dimensions of the sacrificial nanomaterial 14' and thickness of the sacrificial layer 14. It is to be understood that the voids 20A, 20B provide spaces to accommodate the volumetric expansion and contraction of the nanomaterial 12' during battery cycling.

Additionally, the cage-like structure of the carbon layer 16 and the TiO$_2$ layer 18 secures the nanomaterial 12' therein. As such, even if the nanomaterial 12' breaks apart, it is contained within the voids 20A, 20B by the carbon layer 16 and the TiO$_2$ layer 18, which may keep the nanomaterial 12' pieces in conductive contact with each other. The cage-like structure of the carbon layer 16 and the TiO$_2$ layer 18 also protects the sulfur-based nanomaterial 12' (of the lithium sulfur battery), and suppresses polysulfide dissolution into the electrolyte. As such, the cage-like structure of the carbon layer 16 and the TiO$_2$ layer 18 can mitigate the shuttle effect, and in turn improve the efficiency and life cycle of the lithium sulfur battery.

In the example shown in FIGS. 2A through 2E, after removing the sacrificial layer 14 and the sacrificial nanomaterial 14', the nanomaterial 12' may undergo a dealloying process. In this example, the nanomaterial 12' is formed of a composite material of silicon and one of the materials that is immiscible in the silicon. After sacrificial layer 14 and nanomaterial 14' removal, the nanomaterial 12' in the electrode active material 10B may be exposed to phase separation and chemical etching previously described to form porous silicon.

Referring now to FIGS. 3A through 3D, still another example of the method for making still another example of the electrode active material 10C (shown in FIG. 3D) is depicted. As shown in FIG. 3A, this example of the method forms the nanomaterial 12' on a sacrificial nanomaterial 14'.

In this example, the sacrificial nanomaterial 14' may be in the form of nanoparticles, nanorods, nanofibers, or nanowires. The sacrificial nanomaterial 14' may be formed of aluminum oxide or the previously mentioned polymers.

As shown in FIG. 3A, the nanomaterial 12' is coated on the sacrificial nanomaterial 14'. The nanomaterial 12' may be any of the any of the materials and may be deposited via any of the methods previously described for the nanomaterial 12' used in the method of FIGS. 2A-2E.

Carbon is then coated on the nanomaterial 12' to form the carbon layer 16. This is shown in FIG. 3B. The carbon layer 16 may be deposited via any of the methods previously described for the carbon layer 16 used in the method of FIGS. 1A-1D. The carbon layer 16 may also be doped as previously described.

Titanium dioxide is then coated on the carbon layer 16 to form the TiO$_2$ layer 18. This is shown in FIG. 3C. The TiO$_2$ layer 18 may be deposited via any of the methods previously described for the TiO$_2$ layer 18 used in the method of FIGS. 1A-1D. The TiO$_2$ layer 18 may also be doped or made conductive as previously described.

Referring now to FIG. 3D, the sacrificial nanomaterial 14' is then removed to form a void 20' (i.e., free space, unoccupied space, etc.) at the center of the electrode active material 10C. The nanomaterial 12', carbon layer 16 and the TiO$_2$ layer 18 are porous, and a solvent that can leach out the sacrificial nanomaterial 14' (while leaving the other layers 16, 18 and material 12' intact) may be used to remove the sacrificial nanomaterial 14'. For example, an alkali solution may be used to remove the aluminum oxide sacrificial nanomaterial 14'. An example of the alkali solution is 1M NaOH. For another example, an organic solvent may be used to remove the polymer sacrificial nanomaterial 14'. Any organic solvent may be selected that will dissolve the polymer sacrificial nanomaterial 14' and not affect the other layer 16, 18 and material 12'. When the polymer sacrificial nanomaterial 14' is utilized, it may alternatively be removed via heating or plasma etching.

The amount of space that makes up the void 20' may depend upon the dimensions of the sacrificial nanomaterial 14'. It is to be understood that the void 20' provides space to accommodate the volumetric expansion and contraction of the nanomaterial 12 during battery cycling.

Additionally, the cage-like structure of the carbon layer 16 and the TiO$_2$ layer 18 secures the nanomaterial 12' therein. As such, even if the nanomaterial 12 breaks apart, it is contained within the void 20' by the carbon layer 16 and the TiO$_2$ layer 18, which may keep the nanomaterial 12 pieces in conductive contact with each other. The cage-like structure of the carbon layer 16 and the TiO$_2$ layer 18 also protects the sulfur-based nanomaterial 12' (of the lithium sulfur battery), and suppresses polysulfide dissolution into the electrolyte. As such, the cage-like structure of the carbon layer 16 and the TiO$_2$ layer 18 can mitigate the shuttle effect, and in turn improve the efficiency and life cycle of the lithium sulfur battery.

Referring now to FIG. 4, yet another example of the method for making yet another example of the electrode active material 10D (shown in FIG. 5) is depicted. In this example of the method, silicon, silicon suboxide, or silicon alloy nanorods 12" are formed on a seed layer 22 by oblique angle deposition (OAD) or glancing angle deposition (GLAD).

The seed layer 22 may be formed of a copper-silicon gradient that has copper at one end/side and transitions gradually to silicon at the other end/side. The copper end/side can function as a current collector, and the silicon end/side can function as a suitable surface for adhering silicon, silicon suboxide, or silicon alloy nanorods 12" thereto. The adhesion between the nanorods 12" and the seed layer 22 is strong because of the like materials of the nanorods 12" and the silicon end/side of the seed layer 22 upon which the nanorods 12" are formed. Between the copper end/side and the silicon end/side, the composition of the seed layer 22 includes various alloys of Cu—Si. The alloys are copper rich near the copper end/side and are silicon-rich near the silicon end/side.

While not shown in FIG. 4, the surface of the seed layer 22 at the silicon end/side may be structured or rough.

As mentioned above, the silicon, silicon suboxide, or silicon alloy nanorods 12" are formed on the seed layer 22 by oblique angle deposition (OAD) or glancing angle deposition (GLAD). Both oblique angle deposition (OAD) or glancing angle deposition (GLAD) are physical vapor deposition techniques under conditions of obliquely incident flux and limited adatom diffusion. These techniques result in the formation of columnar structures (i.e., nanorods 12"). Geometric shadowing effects and surface diffusion of the adatoms account for the formation of the nanorods 12". The nanorods 12" are oriented toward the vapor source 26, and the oblique incidence angle $\Theta$ (from the seed layer normal) may be adjusted to change the angle of the nanorods 12". In an example, the oblique incidence angle $\Theta$ is >70°. With GLAD, the seed layer 22 is also rotated (e.g., via motor 24, and this rotation can be used to sculpt the nanorods 12" into various morphologies.

The vapor source 26 may employ any physical vapor deposition (PVD) technique, such as magnetron sputter deposition, electron beam evaporation, thermal evaporation, cathodic arc deposition, laser arc deposition, or pulse laser deposition.

In this example of the method, the nanorods 12" are formed, and then the sacrificial layer 14 is formed thereon. In one example, the sacrificial layer 14 may be formed of aluminum oxide and may be deposited by oblique angle deposition, glancing angle deposition, atomic layer deposition, or a wet chemical process. In another example, the sacrificial layer 14 may be formed of a polymer and may be deposited by molecular layer deposition, plasma polymerization, or a wet chemical process.

As shown in FIG. 4, carbon is deposited to form the carbon layer 16 on the sacrificial layer 14, and titanium dioxide is deposited to form the $TiO_2$ layer 18 on the carbon layer 16. In this example of the method, each of these layers may be formed via oblique angle deposition or glancing angle deposition (which employ any of the physical vapor deposition techniques mentioned herein).

When oblique angle deposition or glancing angle deposition are used to form the nanorods 12" and all of the layers 14, 16, 18, the materials may be deposited sequentially in the same deposition run by changing the target.

After the nanorods 12" and the respective layers 14, 16, 18 are formed thereon, the sacrificial layer 14 may be removed to form the electrode active material 10D shown in FIG. 5, which has a void 20 between the nanorod 12" and the carbon layer 16. Both the carbon layer 16 and the $TiO_2$ layer 18 are porous, and a solvent that can leach out the sacrificial layer 14 (while leaving the other layers 16, 18 and nanorod 12" intact) may be used to remove the sacrificial layer 14. As examples, an alkali solution may be used to remove the aluminum oxide sacrificial layer 14, and an organic solvent may be used to remove the polymer sacrificial layer 14. When the polymer sacrificial layer 14 is utilized, it may alternatively be removed via heating. Heating causes the polymer sacrificial layer 14 to decompose.

The amount of space that makes up the void 20 may depend upon the thickness of the sacrificial layer 14. It is to be understood that the void 20 provides space to accommodate the volumetric expansion and contraction of the nanorod 12" during battery cycling. Additionally, the cage-like structure of the carbon layer 16 and the $TiO_2$ layer 18 secures the nanorod 12" therein. As such, even if the nanorod 12" breaks apart, it is contained within the void 20 by the carbon layer 16 and the $TiO_2$ layer 18, which may keep the nanorod 12" pieces in conductive contact with each other.

In FIG. 5, the plurality of electrode active materials 10D together form a negative electrode 28. Because the nanorods 12" are adhered to the current collector (i.e., the copper portion of the seed layer 22) and the carbon layer 16 (and in some instances the $TiO_2$ layer) is conductive, an additional binder and/or conductive filler are not utilized in this example negative electrode 28.

The negative electrode 28 (which includes the silicon-based nanorods 12" as the active material) may be pre-lithiated using a half cell method or any other suitable pre-lithiation method. The lithiated negative electrode 28 may then be used as a negative electrode in either a lithium ion battery (e.g., paired with a lithium-based positive electrode) or a lithium sulfur battery (e.g., paired with a sulfur-based positive electrode).

It is to be understood that the other electrode active materials 10A, 10B and/or 10C disclosed herein may be utilized in other example negative electrodes when the nanomaterial 12, 12' is a silicon-based material. These negative electrodes may be incorporated into either the lithium ion battery or the lithium sulfur battery. It is also to be understood that the other electrode active materials 10A, 10B and/or 10C disclosed herein may be utilized in example positive electrodes when the nanomaterial 12, 12' is a sulfur-based material. These positive electrodes may be incorporated into the lithium sulfur battery.

The electrode active material 10A, 10B and/or 10C may be combined with an additional conductive filler and/or a binder to form the negative electrode when the nanomaterial 12, 12' is a silicon-based material or the positive electrode when the nanomaterial 12, 12' is a sulfur-based material.

Since the electrode active material 10A, 10B, 10C includes the conductive carbon layer 16, the additional conductive filler may or may not be included when forming the negative electrode or the positive electrode. When included, the conductive filler may be a conductive carbon material. The conductive carbon material may be a high surface area carbon, such as acetylene black (e.g., SUPER P® conductive carbon black from TIMCAL). The conductive filler may be included to enhance electron conduction between the electrode active material 10A, 10B, 10C and a negative-side current collector or a positive-side current collector.

The binder may be used to structurally hold the electrode active material 10A, 10B, 10C together within the negative electrode or the positive electrode. Examples of the binder include polyvinylidene fluoride (PVdF), polyethylene oxide (PEO), an ethylene propylene diene monomer (EPDM) rubber, carboxymethyl cellulose (CMC), styrene-butadiene rubber (SBR), styrene-butadiene rubber carboxymethyl cellulose (SBR-CMC), polyacrylic acid (PAA), cross-linked polyacrylic acid-polyethylenimine, polyimide, or any other suitable binder material.

Other suitable binders include polyvinyl alcohol (PVA), sodium alginate, or other water-soluble binders.

In an example of the method for making negative electrodes with the silicon-based electrode active materials 10A, 10B and/or 10C, the silicon-based electrode active materials 10A, 10B and/or 10C may be mixed with the conductive fillers and/or the binder(s). In an example of the method for making the positive electrodes with the sulfur-based electrode active materials 10A, 10B and/or 10C, the sulfur-based electrode active materials 10A, 10B and/or 10C may be mixed with the conductive fillers and the binder(s).

For each of the electrodes, the respective components may be manually mixed by dry-grinding. After all these components are ground together, the ground components are combined with water or organic solvent (depending on the binder used) to form the dispersion/mixture. In an example, the solvent is a polar aprotic solvent. Examples of suitable polar aprotic solvents include dimethylacetamide (DMAC), N-methyl-2-pyrrolidone (NMP), dimethylformamide (DMF), dimethylsulfoxide (DMSO), or another Lewis base, or combinations thereof.

The dispersion/mixture may be mixed by milling. Milling aids in transforming the dispersion/mixture into a coatable slurry. Low-shear milling or high-shear milling may be used to mix the dispersion/mixture. The dispersion/mixture milling time ranges from about 10 minutes to about 20 hours depending on the milling shear rate. In an example, a rotator mixer is used for about 20 minutes at about 2000 rpm to mill the dispersion/mixture.

In one example of the dispersion/mixture for the negative electrode, the amount of the silicon-based electrode active materials 10A, 10B and/or 10C ranges from about 70 wt. % to about 95 wt. % (based on total solid wt. % of the dispersion/mixture), the amount of the conductive filler ranges from 0 wt. % to about 15 wt. % (based on total solid wt. % of the dispersion/mixture), and the amount of the binder ranges from about 5 wt. % to about 15 wt. % (based on total solid wt. % of the dispersion/mixture).

In one example of the dispersion/mixture for the positive electrode, the amount of the sulfur-based electrode active materials 10A, 10B and/or 10C ranges from about 70 wt. % to about 95 wt. % (based on total solid wt. % of the dispersion/mixture), the amount of the conductive filler ranges from 0 wt. % to about 15 wt. % (based on total solid wt. % of the dispersion/mixture), and the amount of the binder ranges from about 5 wt. % to about 15 wt. % (based on total solid wt. % of the dispersion/mixture).

The respective slurry is then coated or deposited onto the respective current collector (e.g., copper for the negative electrode and aluminum for the positive electrode). The slurry may be deposited using any suitable technique. As examples, the slurry may be cast on the surface of the current collector, or may be spread on the surface of the current collector, or may be coated on the surface of the current collector using a slot die coater.

The deposited slurry may be exposed to a drying process in order to remove any remaining solvent and/or water. Drying may be accomplished using any suitable technique. For example, drying may be performed at an elevated temperature ranging from about 60° C. to about 130° C. In some examples, vacuum may also be used to accelerate the drying process. As one example of the drying process, the deposited slurry may be exposed to vacuum at about 120° C. for about 12 to 24 hours. The drying process results in the formation of the negative electrode or the positive electrode.

Figure 6:
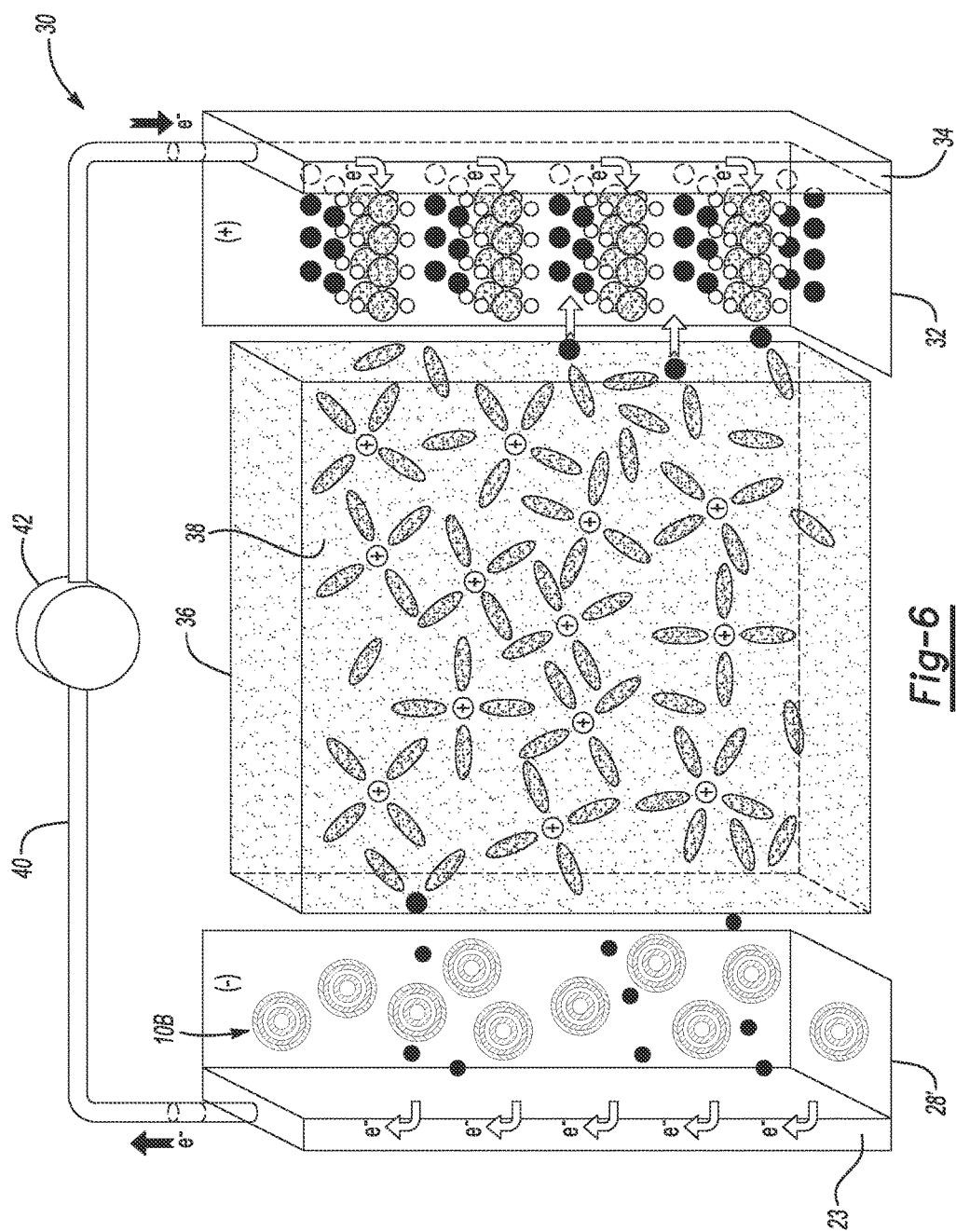
FIG. 6 is a perspective schematic view of an example of a lithium ion battery showing a discharging state, the battery including a negative electrode formed with an example of the electrode active material disclosed herein.

An example of the negative electrode 28' formed with the electrode active material 10B is depicted in FIG. 6, which also shows an example of the lithium ion battery 30. The electrode active material 10B may be replaced with or combined with any of the electrode active materials 10A and/or 10C, as along as the nanomaterial 12, 12' is silicon, silicon suboxide, or a silicon alloy.

In the lithium ion battery 30, the negative electrode 28' on the negative-side current collector 23 is paired with a positive electrode 32 on a positive side current collector 34 (e.g., aluminum). The positive electrode 32 includes any lithium-based active material that can sufficiently undergo lithium insertion and deinsertion while aluminum or another suitable current collector 16 is functioning as the positive terminal of the lithium ion battery 30. One common class of known lithium-based active materials suitable for the positive electrode 32 includes layered lithium transition metal oxides. For example, the lithium-based active material may be spinel lithium manganese oxide ($LiMn_2O_4$), lithium cobalt oxide ($LiCoO_2$), a manganese-nickel oxide spinel [$Li(Mn_{1.5}Ni_{0.5})O_2$], a layered nickel-manganese-cobalt oxide (having a general formula of $xLi_2MnO_3.(1-x)LiMO_2$, where M is composed of any ratio of Ni, Mn and/or Co). A specific example of the layered nickel-manganese-cobalt oxide includes ($xLi_2MnO_3.(1-x)Li(Ni_{1/3}Mn_{1/3}Co_{1/3})O_2$). Other suitable lithium-based active materials include $Li(Ni_{1/3}Mn_{1/3}Co_{1/3})O_2$, $Li_{x+y}Mn_{2-y}O_4$ (LMO, $0<x<1$ and $0<y<0.1$), or a lithium iron polyanion oxide, such as lithium iron phosphate (LiFePO4) or lithium iron fluorophosphate ($Li_2FePO_4F$), or a lithium rich layer-structure. Still other lithium based active materials may also be utilized, such as $LiNi_{1-x}Co_{1-y}M_{x+y}O_2$ or $LiMn_{1.5-x}Ni_{0.5-y}M_{x+y}O_4$ (M is composed of any ratio of Al, Ti, Cr, and/or Mg), stabilized lithium manganese oxide spinel ($Li_xMn_{2-y}M_yO_4$, where M is composed of any ratio of Al, Ti, Cr, and/or Mg), lithium nickel cobalt aluminum oxide (e.g., $LiNi_{0.8}Co_{0.15}Al_{0.05}O_2$ or NCA), aluminum stabilized lithium manganese oxide spinel (e.g., $Li_xAl_{0.05}Mn_{0.95}O_2$), lithium vanadium oxide ($LiV_2O_5$), $Li_2MSiO_4$ (where M is composed of any ratio of Co, Fe, and/or Mn), and any other high energy nickel-manganese-cobalt material (HE-NMC, NMC or $LiNiMnCoO_2$). By "any ratio" it is meant that any element may be present in any amount. So, in some examples, M could be Al, with or without Cr, Ti, and/or Mg, or any other combination of the listed elements. In another example, anion substitutions may be made in the lattice of any example of the lithium transition metal based active material to stabilize the crystal structure. For example, any O atom may be substituted with an F atom.

The positive electrode 32 may also include any of the binder materials and/or conductive filler materials previously described.

The lithium ion battery 30 also includes the porous polymer separator 36 positioned between the positive and negative electrodes 32, 28'. The porous polymer separator 36 may be formed, e.g., from a polyolefin. The polyolefin may be a homopolymer (derived from a single monomer constituent) or a heteropolymer (derived from more than one monomer constituent), and may be either linear or branched. If a heteropolymer derived from two monomer constituents is employed, the polyolefin may assume any copolymer chain arrangement including those of a block copolymer or a random copolymer. The same holds true if the polyolefin is a heteropolymer derived from more than two monomer constituents. As examples, the polyolefin may be polyethylene (PE), polypropylene (PP), a blend of PE and PP, or multi-layered structured porous films of PE and/or PP. Commercially available porous separators 22 include single layer polypropylene membranes, such as CELGARD 2400 and CELGARD 2500 from Celgard, LLC (Charlotte, N.C.). It is to be understood that the porous separator 36 may be coated or treated, or uncoated or untreated. For example, the porous separator 36 may or may not be coated or include any surfactant treatment thereon.

In other examples, the porous separator 36 may be formed from another polymer chosen from polyethylene terephthalate (PET), polyvinylidene fluoride (PVdF), polyamides (Nylons), polyurethanes, polycarbonates, polyesters, polyetheretherketones (PEEK), polyethersulfones (PES), polyimides (PI), polyamide-imides, polyethers, polyoxymethylene (e.g., acetal), polybutylene terephthalate, polyethylenenaphthenate, polybutene, polyolefin copolymers, acrylonitrile-butadiene styrene copolymers (ABS), polystyrene copolymers, polymethylmethacrylate (PMMA), polyvinyl chloride (PVC), polysiloxane polymers (such as polydimethylsiloxane (PDMS)), polybenzimidazole (PBI), polybenzoxazole (PBO), polyphenylenes (e.g., PARMAX™ (Mississippi Polymer Technologies, Inc., Bay Saint Louis, Miss.)), polyarylene ether ketones, polyperfluorocyclobutanes, polytetrafluoroethylene (PTFE), polyvinylidene fluoride copolymers and terpolymers, polyvinylidene chloride, polyvinylfluoride, liquid crystalline polymers (e.g., VECTRAN™ (Hoechst AG, Germany) and ZENITE® (DuPont, Wilmington, Del.)), polyaramides, polyphenylene oxide, and/or combinations thereof. It is believed that another example of a liquid crystalline polymer that may be used for the porous separator 36 is poly(p-hydroxybenzoic acid). In yet another example, the porous separator 36 may be chosen from a combination of the polyolefin (such as PE and/or PP) and one or more of the other polymers listed above.

The porous separator 36 may be a single layer or may be a multi-layer (e.g., bilayer, trilayer, etc.) laminate fabricated from either a dry or wet process.

In the lithium ion battery 30, the porous separator 36 operates as an electrical insulator (preventing the occurrence of a short), a mechanical support, and a barrier to prevent physical contact between the two electrodes 32, 28'. The porous separator 36 also ensures passage of lithium ions (identified by the black dots and by the open circles having a (+) charge) through the electrolyte solution 38 filling its pores.

The electrolyte solution 38 of the lithium ion battery 30 includes an organic solvent and a lithium salt dissolved in the organic solvent. Examples of the organic solvent include cyclic carbonates (ethylene carbonate (EC), propylene carbonate, butylene carbonate, fluoroethylene carbonate), linear carbonates (dimethyl carbonate (DMC), diethyl carbonate (DEC), ethylmethyl carbonate (EMC)), aliphatic carboxylic esters (methyl formate, methyl acetate, methyl propionate), γ-lactones (γ-butyrolactone, γ-valerolactone), chain structure ethers (1,2-dimethoxyethane, 1,2-diethoxyethane, ethoxymethoxyethane), cyclic ethers (tetrahydrofuran, 2-methyltetrahydrofuran), and mixtures thereof. In an example, the electrolyte solution 38 is a mixture of ethylene carbonate, dimethyl carbonate, and diethyl carbonate. Examples of the lithium salt include $LiClO_4$, $LiAlCl_4$, LiI, LiBr, LiSCN, $LiBF_4$, $LiB(C_6H_5)_4$, $LiAsF_6$, $LiCF_3SO_3$, $LiN(FSO_2)_2$ (LIFSI), $LiN(CF_3SO_2)_2$ (LITFSI), $LiPF_6$, $LiB(C_2O_4)_2$ (LiBOB), $LiBF_2(C_2O_4)$ (LiODFB), $LiPF_3(C_2F_5)_3$ (LiFAP), $LiPF_4(CF_3)_2$, $LiPF_4(C_2O_4)$ (LiFOP), $LiNO_3$, $LiPF_3(CF_3)_3$, $LiSO_3CF_3$, and mixtures thereof. In an example, the concentration of the salt in the electrolyte solution 24 is about 1 mol/L. $LiNO_3$ may also be added to the electrolyte solution 36 as another additive, in addition to the lithium salt. In these instances, the concentration of the lithium salt may be about 0.6 mol/L plus the $LiNO_3$ additive.

As shown in FIG. 6, the lithium ion battery 30 also includes the interruptible external circuit 40 that connects the negative electrode 28' and the positive electrode 32. The lithium ion battery 30 may also support the load device 42 that can be operatively connected to the external circuit 40. In this example, the load device 42 receives a feed of electrical energy from the electric current passing through the external circuit 40 when the lithium ion battery 30 is discharging. While the load device 42 may be any number of known electrically-powered devices, a few specific examples of a power-consuming load device include an electric motor for a hybrid vehicle or an all-electrical vehicle, a laptop computer, a cellular phone, and a cordless power tool. The load device 42 may also, however, be a power-generating apparatus that charges the lithium ion battery 30 for purposes of storing energy. For instance, the tendency of windmills and solar panels to variably and/or intermittently generate electricity often results in a need to store surplus energy for later use.

The lithium ion battery 30 may also include a wide range of other components that, while not depicted here, are known to skilled artisans. For instance, the lithium ion battery 30 may include a casing, gaskets, terminals, tabs, and any other desirable components or materials that may be situated between or around the negative electrode 28' and the positive electrode 32 for performance-related or other practical purposes. Moreover, the size and shape of the lithium ion battery 30, as well as the design and chemical make-up of its main components, may vary depending on the particular application for which it is designed. The lithium ion battery 30 may also be connected in series and/or in parallel with other similar lithium ion batteries to produce a greater voltage output and current (if arranged in parallel) or voltage (if arranged in series) if the load device 42 so requires.

The lithium ion battery 30 generally operates by reversibly passing lithium ions between the negative electrode 28' and the positive electrode 42. In the fully charged state, the voltage of the battery 30 is at a maximum (typically in the range 3.0V to 5.0V); while in the fully discharged state, the voltage of the battery 30 is at a minimum (typically in the range 1.0V to 3.0V). Essentially, the Fermi energy levels of the active materials in the positive and negative electrodes 32, 28' change during battery operation, and so does the difference between the two, known as the battery voltage. The battery voltage decreases during discharge, with the Fermi levels getting closer to each other. During charge, the reverse process is occurring, with the battery voltage increasing as the Fermi levels are being driven apart. During battery discharge, the external load device 42 enables an electronic current flow in the external circuit 40 with a direction such that the difference between the Fermi levels (and, correspondingly, the cell voltage) decreases. The reverse happens during battery charging: the battery charger forces an electronic current flow in the external circuit 40 with a direction such that the difference between the Fermi levels (and, correspondingly, the cell voltage) increases.

At the beginning of a discharge, the negative electrode 28' of the lithium ion battery 30 contains a high concentration of intercalated lithium while the positive electrode 32 is relatively depleted. When the negative electrode 28' contains a sufficiently higher relative quantity of intercalated lithium, the lithium ion battery 30 can generate a beneficial electric current by way of reversible electrochemical reactions that occur when the external circuit 40 is closed to connect the negative electrode 28' and the positive electrode 32. The establishment of the closed external circuit under such circumstances causes the extraction of intercalated lithium from the negative electrode 28'. The extracted lithium atoms are split into lithium ions (identified by the black dots and by the open circles having a (+) charge) and electrons ($e^-$) as they leave an intercalation host (i.e., the silicon-based electrode active material 10B).

The chemical potential difference between the positive electrode 32 and the negative electrode 28' (ranging from about 3.0 volts to about 5.0 volts, depending on the exact chemical make-up of the electrodes 32, 28') drives the electrons ($e^-$) produced by the oxidation of intercalated lithium at the negative electrode 28' through the external circuit 40 towards the positive electrode 32. The lithium ions are concurrently carried by the electrolyte solution 38 through the porous polymer separator 36 towards the positive electrode 32. The electrons ($e^-$) flowing through the external circuit 40 and the lithium ions migrating across the porous polymer separator 36 in the electrolyte solution 38 eventually reconcile and form intercalated lithium at the positive electrode 32. The electric current passing through the external circuit 40 can be harnessed and directed through the load device 42 until the level of intercalated lithium in the negative electrode 28' falls below a workable level or the need for electrical energy ceases.

The lithium ion battery 30 may be recharged after a partial or full discharge of its available capacity. To charge the lithium ion battery 30, an external battery charger is connected to the positive and the negative electrodes 32, 28', to drive the reverse of battery discharge electrochemical reactions. During recharging, the electrons ($e^-$) flow back toward the negative electrode 28' through the external circuit 40, and the lithium ions are carried by the electrolyte 38 across the porous polymer separator 36 back toward the negative electrode 28'. The electrons ($e^-$) and the lithium ions are reunited at the negative electrode 28', thus replenishing it with intercalated lithium for consumption during the next battery discharge cycle.

The external battery charger that may be used to charge the lithium ion battery 30 may vary depending on the size, construction, and particular end-use of the lithium ion battery 30. Some suitable external battery chargers include a battery charger plugged into an AC wall outlet and a motor vehicle alternator.

Figure 7:
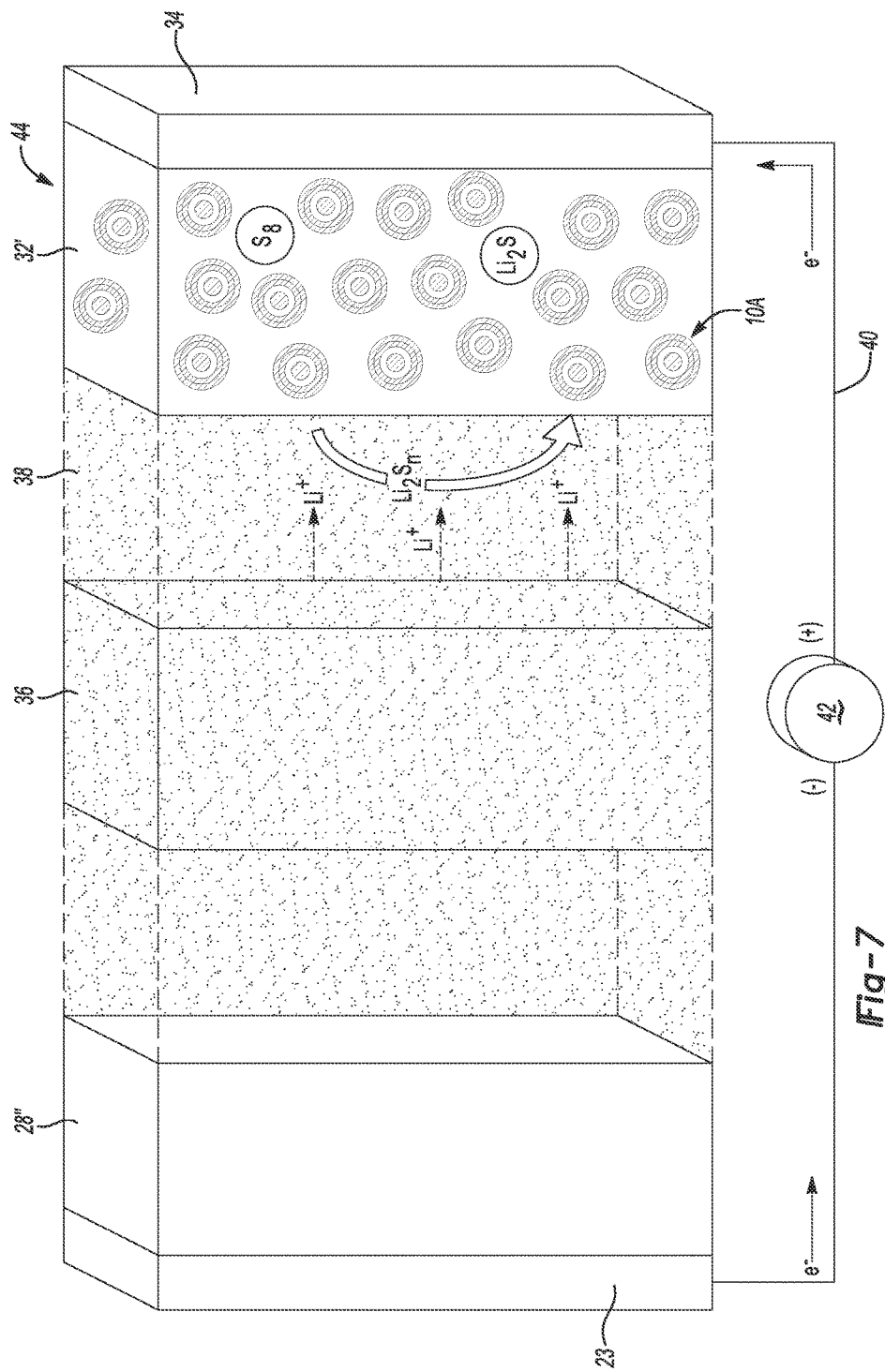
FIG. 7 is a perspective schematic view of a lithium sulfur battery showing a discharging state, the battery including a positive electrode formed with an example of the electrode active material disclosed herein.

An example of the positive electrode 32' formed with the electrode active material 10A is depicted in FIG. 7, which also shows an example of the lithium sulfur battery 44. The electrode active material 10A may be replaced with or combined with any of the electrode active materials 10B and/or 10C, as along as the nanomaterial 12, 12' is a sulfur-based active material (i.e., a sulfur-carbon composite).

In the lithium sulfur battery 44, the positive electrode 32' on the positive-side current collector 34 is paired with a negative electrode 28" on a negative side current collector 23 (e.g., copper). The negative electrode 28" may be negative electrode 28 shown in FIG. 5, or may be formed with any of the silicon-based electrode active materials 10A, 10B and/or 10C, or may be formed with another suitable active material, such as graphite, lithium foil, lithium titanate, etc. Depending upon the active material used, the negative electrode 28" may or may not include a conductive filler and/or binder (examples of which are previously described).

The lithium sulfur battery 44 also includes the porous polymer separator 36. Any of the examples of the separator 36 for the lithium ion battery 30 may be used. In the lithium sulfur battery 44, the porous polymer separator 36 operates as both an electrical insulator and a mechanical support. The porous polymer separator 36 is sandwiched between the positive electrode 32' and the negative electrode 28" to prevent physical contact between the two electrodes 32', 28" and the occurrence of a short circuit. The porous polymer separator 36, in addition to providing a physical barrier between the two electrodes 32', 28" ensures passage of lithium ions (identified by the Li$^+$) and some related anions through an electrolyte solution 38' filling its pores.

Any appropriate electrolyte solution that can conduct lithium ions between the negative electrode 28" and the positive electrode 32' may be used in the lithium sulfur battery 44. In one example, the non-aqueous electrolyte solution may be an ether based electrolyte that is stabilized with lithium nitrite. Other non-aqueous liquid electrolyte solutions may include a lithium salt dissolved in an organic solvent or a mixture of organic solvents. Any of the previously provided examples of lithium salts may be used. The ether based solvents may be composed of cyclic ethers, such as 1,3-dioxolane, tetrahydrofuran, 2-methyltetrahydrofuran, and chain structure ethers, such as 1,2-dimethoxyethane, 1-2-diethoxyethane, ethoxymethoxyethane, tetraethylene glycol dimethyl ether (TEGDME), polyethylene glycol dimethyl ether (PEGDME), and mixtures thereof.

The lithium sulfur battery 44 also includes an interruptible external circuit 40 that connects the positive electrode 32' and the negative electrode 28". The lithium sulfur battery 44 may also support a load device 42 that can be operatively connected to the external circuit 40. The load device 42 may be powered fully or partially by the electric current passing through the external circuit 40 when the lithium sulfur battery 44 is discharging. While the load device 42 may be any number of known electrically-powered devices, a few specific examples of a power-consuming load device include an electric motor for a hybrid vehicle or an all-electrical vehicle, a laptop computer, a cellular phone, and a cordless power tool. The load device 42 may also, however, be a power-generating apparatus that charges the lithium sulfur battery 44 for purposes of storing energy. For instance, the tendency of windmills and solar panels to variably and/or intermittently generate electricity often results in a need to store surplus energy for later use.

The lithium sulfur battery 44 can include a wide range of other components that, while not depicted here, are nonetheless known to skilled artisans. For instance, the lithium sulfur battery 44 may include a casing, gaskets, terminals, tabs, and any other desirable components or materials that may be situated between or around the positive electrode 32' and the negative electrode 28" for performance-related or other practical purposes. Moreover, the size and shape of the lithium sulfur battery 44, as well as the design and chemical make-up of its main components, may vary depending on the particular application for which it is designed. Battery-powered automobiles and hand-held consumer electronic devices, for example, are two instances where the lithium sulfur battery 44 would most likely be designed to different size, capacity, and power-output specifications. The lithium sulfur battery 44 may also be connected in series and/or in parallel with other similar lithium sulfur batteries 44 to produce a greater voltage output and current (if arranged in parallel) or voltage (if arranged in series) if the load device 42 so requires.

The lithium sulfur battery 44 can generate a useful electric current during battery discharge (shown in FIG. 7). During discharge, the chemical processes in the battery 44 include lithium (Li$^+$) dissolution from the negative electrode 28" and incorporation of the lithium cations into sulfur or high form polysulfide anions (i.e., $S_x^{2-}$) within the sulfur-based electrode active materials 10A. As such, polysulfides are formed (sulfur is reduced) within the active materials 10A in the positive electrode 32' in sequence while the battery 44 is discharging. The chemical potential difference between the positive electrode 32' and the negative electrode 28" (ranging from approximately 1.5V to 3.0V, depending on the exact chemical make-up of the electrodes 32', 28") drives electrons produced by the dissolution of lithium at the negative electrode 28" through the external circuit 40 towards the positive electrode 32'. The resulting electric current passing through the external circuit 40 can be harnessed and directed through the load device 42 until the level of intercalated lithium in the negative electrode 28' falls below a workable level or the need for electrical energy ceases.

The lithium sulfur battery 44 can be charged or re-powered at any time by applying an external power source to the lithium sulfur battery 44 to reverse the electrochemical reactions that occur during battery discharge. During charging (not shown), lithium plating to the negative electrode 28" takes place and sulfur formation at the positive electrode 32' takes place. The connection of an external power source to the lithium sulfur battery 44 compels the otherwise non-spontaneous oxidation of lithium at the positive electrode 32' to produce electrons and lithium ions. The electrons, which flow back towards the negative electrode 28" through the external circuit 40, and the lithium ions (Li$^+$), which are carried by the electrolyte 38' across the porous polymer separator 36 back towards the negative electrode 28", reunite at the negative electrode 28" and replenish it with lithium for consumption during the next battery discharge cycle. The external power source that may be used to charge the lithium sulfur battery 44 may vary depending on the size, construction, and particular end-use of the lithium sulfur battery 44. Some suitable external power sources include a battery charger plugged into an AC wall outlet and a motor vehicle alternator.

The electrode active materials 10A, 10B, 10C, and 10D disclosed herein exhibit less strain than materials formed via other methods, in part because the growth stress is lower.

It is to be understood that the ranges provided herein include the stated range and any value or sub-range within the stated range. For example, a range of from about 100 nm to about 20 µm should be interpreted to include not only the explicitly recited limits of from about 100 nm to about 20 µm, but also to include individual values, such as 125 nm, 150.5 nm, 2 µm, etc., and sub-ranges, such as from about 130 nm to about 10 µm; from about 500 nm to about 5 µm, etc. Furthermore, when "about" is utilized to describe a value, this is meant to encompass minor variations (up to +/−5%) from the stated value.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

The invention claimed is:

1. A method for making an electrode active material, the method comprising:
   forming a sacrificial layer on a nanomaterial, wherein the sacrificial layer is selected from the group consisting of an aluminum oxide layer and a polymer layer;
   coating the sacrificial layer with carbon to form a carbon layer;
   coating the carbon layer with titanium dioxide to form a titanium dioxide layer; and
   after the coating the carbon layer with the titanium dioxide, removing the sacrificial layer, thereby forming a first void between the nanomaterial and the carbon layer.

2. The method as defined in claim 1 wherein the sacrificial layer is the polymer layer and wherein the removing of the sacrificial layer is accomplished using heating or an organic solvent to dissolve the polymer layer.

3. The method as defined in claim 1 wherein the sacrificial layer is the aluminum oxide layer and wherein the removing of the sacrificial layer is accomplished using an alkali solution.

4. The method as defined in claim 1 wherein the coating of the sacrificial layer with carbon is accomplished by one of:
   a deposition technique that involves reducing a deposition temperature down to about 18° C. to about 22° C.; or
   reactive sputtering with graphite as a target.

5. The method as defined in claim 1 wherein:
   prior to forming the sacrificial layer, the method further comprises coating or forming the nanomaterial on a sacrificial nanomaterial; and
   the removing of the sacrificial layer also includes removing the sacrificial nanomaterial to form a second void at a center of the nanomaterial.

6. The method as defined in claim 1 wherein:
   the nanomaterial is silicon nanorods, silicon suboxide nanorods ($SiO_x$ where $0<x<2$), or silicon alloy nanorods; and
   prior to the forming of the sacrificial layer on the nanomaterial, the method further comprises forming the silicon nanorods, the silicon suboxide nanorods ($SiO_x$ where $0<x<2$), or the silicon alloy nanorods on a seed layer having a copper-silicon gradient by oblique angle deposition or glancing angle deposition.

7. The method as defined in claim 6 wherein the sacrificial layer is the polymer layer deposited by molecular layer deposition, plasma polymerization, or wet chemistry.

8. The method as defined in claim 6 wherein the sacrificial layer is the aluminum oxide layer formed using oblique angle deposition, glancing angle deposition, atomic layer deposition, or wet chemistry.

9. The method as defined in claim 1 wherein the nanomaterial is a porous silicon nanomaterial, and wherein the method further comprises forming the porous silicon nanomaterial by:
   preparing composite particles of silicon in an amorphous phase and a material that is immiscible with the silicon;
   inducing phase separation within the composite particles to precipitate out the silicon and form phase separated composite particles; and
   chemically etching the immiscible material from the phase separated composite particles, thereby forming the porous silicon nanomaterial.

10. The method as defined in claim 1 wherein the forming of the sacrificial layer, the coating of the sacrificial layer with the carbon, and the coating of the carbon layer with the titanium dioxide are accomplished by plasma-enhanced chemical vapor deposition, chemical vapor deposition, molecular layer deposition, atomic layer deposition, or a wet chemical process.

11. The method as defined in claim 1 wherein during or after the coating the carbon layer with the titanium dioxide and after the removing the sacrificial layer, the method further comprises doping the titanium dioxide with a conductive additive.

12. A method for making an electrode active material, the method comprising:
   forming a sacrificial layer on a nanomaterial;
   coating the sacrificial layer with carbon to form a carbon layer by one of:
      a deposition technique that involves reducing a deposition temperature down to about 18° C. to about 22° C.; or
      reactive sputtering with graphite as a target;
   coating the carbon layer with titanium dioxide to form a titanium dioxide layer; and
   after the coating the carbon layer with the titanium dioxide, removing the sacrificial layer, thereby forming a first void between the nanomaterial and the carbon layer.

13. The method as defined in claim 12 wherein:
   prior to forming the sacrificial layer, the method further comprises coating or forming the nanomaterial on a sacrificial nanomaterial; and
   the removing of the sacrificial layer also includes removing the sacrificial nanomaterial to form a second void at a center of the nanomaterial.

14. The method as defined in claim 12 wherein:
   the nanomaterial is silicon nanorods, silicon suboxide nanorods ($SiO_x$ where $0<x<2$), or silicon alloy nanorods; and prior to the forming of the sacrificial layer on the nanomaterial, the method further comprises forming the silicon nanorods, the silicon suboxide nanorods ($SiO_x$ where $0<x<2$), or the silicon alloy nanorods on a seed layer having a copper-silicon gradient by oblique angle deposition or glancing angle deposition.

15. The method as defined in claim 12 wherein the nanomaterial is a porous silicon nanomaterial, and wherein the method further comprises forming the porous silicon nanomaterial by:
   preparing composite particles of silicon in an amorphous phase and a material that is immiscible with the silicon;
   inducing phase separation within the composite particles to precipitate out the silicon and form phase separated composite particles; and
chemically etching the immiscible material from the phase separated composite particles, thereby forming the porous silicon nanomaterial.

16. The method as defined in claim 12 wherein the forming of the sacrificial layer and the coating of the carbon layer with the titanium dioxide are accomplished by plasma-enhanced chemical vapor deposition, chemical vapor deposition, molecular layer deposition, atomic layer deposition, or a wet chemical process.

17. A method for making an electrode active material, the method comprising:
   forming a first sacrificial layer on a nanomaterial;
   coating the sacrificial layer with carbon to form a carbon layer;
   coating the carbon layer with titanium dioxide to form a titanium dioxide layer; and
   after the coating the carbon layer with the titanium dioxide, removing the sacrificial layer, thereby forming a first void between the nanomaterial and the carbon layer, wherein the forming of the sacrificial layer, the coating of the sacrificial layer with the carbon, and the coating of the carbon layer with the titanium dioxide are accomplished by plasma-enhanced chemical vapor deposition, chemical vapor deposition, molecular layer deposition, atomic layer deposition, or a wet chemical process.

18. The method as defined in claim 17 wherein:
prior to forming the sacrificial layer, the method further comprises coating or forming the nanomaterial on a sacrificial nanomaterial; and
the removing of the sacrificial layer also includes removing the sacrificial nanomaterial to form a second void at a center of the nanomaterial.

19. The method as defined in claim 17 wherein:
the nanomaterial is silicon nanorods, silicon suboxide nanorods ($SiO_x$ where $0<x<2$), or silicon alloy nanorods; and
prior to the forming of the sacrificial layer on the nanomaterial, the method further comprises forming the silicon nanorods, the silicon suboxide nanorods ($SiO_x$ where $0<x<2$), or the silicon alloy nanorods on a seed layer having a copper-silicon gradient by oblique angle deposition or glancing angle deposition.

20. The method as defined in claim 17 wherein the nanomaterial is a porous silicon nanomaterial, and wherein the method further comprises forming the porous silicon nanomaterial by:
   preparing composite particles of silicon in an amorphous phase and a material that is immiscible with the silicon;
   inducing phase separation within the composite particles to precipitate out the silicon and form phase separated composite particles; and
chemically etching the immiscible material from the phase separated composite particles, thereby forming the porous silicon nanomaterial.

* * * * *